United States Patent
Yeh et al.

(10) Patent No.: US 9,593,887 B2
(45) Date of Patent: Mar. 14, 2017

(54) HEAT DISSIPATION STRUCTURE WITH HEAT PIPES ARRANGED IN TWO SPACED AND PARTIALLY OVERLAPPED LAYERS

(71) Applicant: TAI-SOL ELECTRONICS CO., LTD., Taipei (TW)

(72) Inventors: Yun-Yeu Yeh, Taipei (TW); Sheng-Chin Chan, Taipei (TW)

(73) Assignee: TAI-SOL ELECTRONICS CO., LTD, Taipei (TW)

( * ) Notice: Subject to any disclaimer, the term of this patent is extended or adjusted under 35 U.S.C. 154(b) by 158 days.

(21) Appl. No.: 14/726,186

(22) Filed: May 29, 2015

(65) Prior Publication Data

US 2016/0298909 A1  Oct. 13, 2016

(30) Foreign Application Priority Data

Apr. 13, 2015  (TW) .............................. 104111839 A

(51) Int. Cl.
*H01L 23/427* (2006.01)
*F28D 15/02* (2006.01)
*F28F 1/32* (2006.01)

(52) U.S. Cl.
CPC ............ *F28D 15/0275* (2013.01); *F28F 1/32* (2013.01); *F28F 1/325* (2013.01); *H01L 23/427* (2013.01)

(58) Field of Classification Search
CPC .............. F28D 15/0275; H01L 23/467; H05K 7/20336

See application file for complete search history.

(56) References Cited

U.S. PATENT DOCUMENTS

2012/0305221 A1  12/2012  Huang

*Primary Examiner* — Allen Flanigan
(74) *Attorney, Agent, or Firm* — Muncy, Geissler, Olds & Lowe, P.C.

(57) ABSTRACT

A heat dissipation structure with heat pipes arranged in two spaced and partially overlapped layers is disclosed to include a radiation fin set, a heat-dissipation spacer placed on the radiation fin set and defining opposing first surface and second surface, a first heat dissipation layer including multiple first heat pipes with respective first segments thereof placed on the first surface of the heat-dissipation spacer, and a second heat dissipation layer including multiple second heat pipes with respective first segments thereof placed on the second surface of the heat-dissipation spacer. At least a part of the first segment of at least one first heat pipe of the first heat dissipation layer is disposed overlapped on at least a part of the first segment of at least one second heat pipe of the second heat dissipation layer in a parallel manner.

6 Claims, 4 Drawing Sheets

HEAT DISSIPATION STRUCTURE WITH HEAT PIPES ARRANGED IN TWO SPACED AND PARTIALLY OVERLAPPED LAYERS

BACKGROUND OF THE INVENTION

1. Field of the Invention

The present invention relates to cooling technology and more particularly, to a heat dissipation structure with heat pipes arranged in two spaced and partially overlapped layers

2. Description of the Related Art

U.S. Patent 20120305221A1 discloses a heat dissipation structure entitled "Heat pipe-attached heat sink", which comprises a radiation fin module 10, a plurality of heat pipes 20, and a bottom block 30. The radiation fin module 10 consists of a plurality of first radiation fins 1 and a plurality of second radiation fins 1a. Further, the radiation fin module 10 comprises two protruding blocks 101 and a plurality of recessed portions 112. The bottom block 30 comprises an opening 31, and a plurality of recessed portions 32 arranged on the flat bottom wall at one or two opposite sides relative to the opening 31. In installation, the protruding blocks 101 of the radiation fin module 10 are press-fitted into the opening 31 of the bottom block 30 to keep the recessed portions 32 in alignment with the recessed portions 112 of the radiation fin module 10, and then the heat pipes 20 are attached to the flat bottom wall of the bottom block 30 and the first radiation fins 1 of the radiation fin module 10 to force the heat pipes 20 into tight engagement with the recessed portions 32 of the bottom block 30 and the recessed portions 112 of the radiation fin module 10. In application, the heat pipes are kept in direct contact with the heat source to minimize impedance during heat transfer, enhancing heat transfer speed and heat dissipation performance.

The aforesaid prior art heat sink design uses heat pipes for transferring heat. However, because these heat pipes are arranged in one single layer, the heat dissipation performance is still not optimal. Therefore, there is still room for improvement.

SUMMARY OF THE INVENTION

The present invention has been accomplished under the circumstances in view. It is the main object of the present invention to provide a heat dissipation structure, which has heat pipes thereof arranged in two spaced and partially overlapped layers for quick dissipation of heat energy from an object to be cooled down.

To achieve this and other objects of the present invention, a heat dissipation structure with heat pipes arranged in two spaced and partially overlapped layers comprises a heat-dissipation spacer, a first heat dissipation layer, a second heat dissipation layer and a radiation fin set. The heat-dissipation spacer comprises a first surface, and a second surface opposite to the first surface. The first heat dissipation layer consists of a plurality of first heat pipes. Each first heat pipe defines a first segment, a second segment and a third segment. The second segment of each first heat pipe is connected between the first segment and third segment of the respective first heat pipe. The first segments of the first heat pipes are placed on the first surface of the heat-dissipation spacer. The first segments of the first heat pipes are disposed in parallel. The second heat dissipation layer consists of a plurality of second heat pipes. Each second heat pipe defines a first segment, a second segment and a third segment. The second segment of each second heat pipe is connected between the first segment and third segment of the respective second heat pipe. The first segments of the second heat pipes are placed on the second surface of the heat-dissipation spacer. The first segments of the second heat pipes are disposed in parallel. The radiation fin set consists of a plurality of radiation fins. The radiation fins have a respective same peripheral edge arranged together to constitute a contact surface. The second surface of the heat-dissipation spacer is placed on the contact surface of the radiation fin set. The first segments of the second heat pipes of the second heat dissipation layer are set in between the heat-dissipation spacer and the radiation fin set, and kept in positive contact with the heat-dissipation spacer and the radiation fin set. The third segments of the first heat pipes of the first heat dissipation layer and the third segments of the second heat pipes of the second heat dissipation layer are respectively inserted through the radiation fin set. Further, at least a part of the first segment of at least one first heat pipe of the first heat dissipation layer is kept overlapped on at least a part of the first segment of at least one second heat pipe of the second heat dissipation layer in a parallel manner.

Thus, subject to the arrangement that at least a part of the first segment of at least one first heat pipe of the first heat dissipation layer is kept overlapped on at least a part of the first segment of at least one second heat pipe of the second heat dissipation layer in a parallel manner, the invention enables heat energy to be rapidly transferred from the object to be cooled down through the first heat dissipation layer, the heat-dissipation spacer and the second heat dissipation layer to the radiation fin set for quick dissipation.

Other advantages and features of the present invention will be fully understood by reference to the following specification in conjunction with the accompanying drawings, in which like reference signs denote like components of structure.

DETAILED DESCRIPTION OF THE INVENTION

Figure 1:
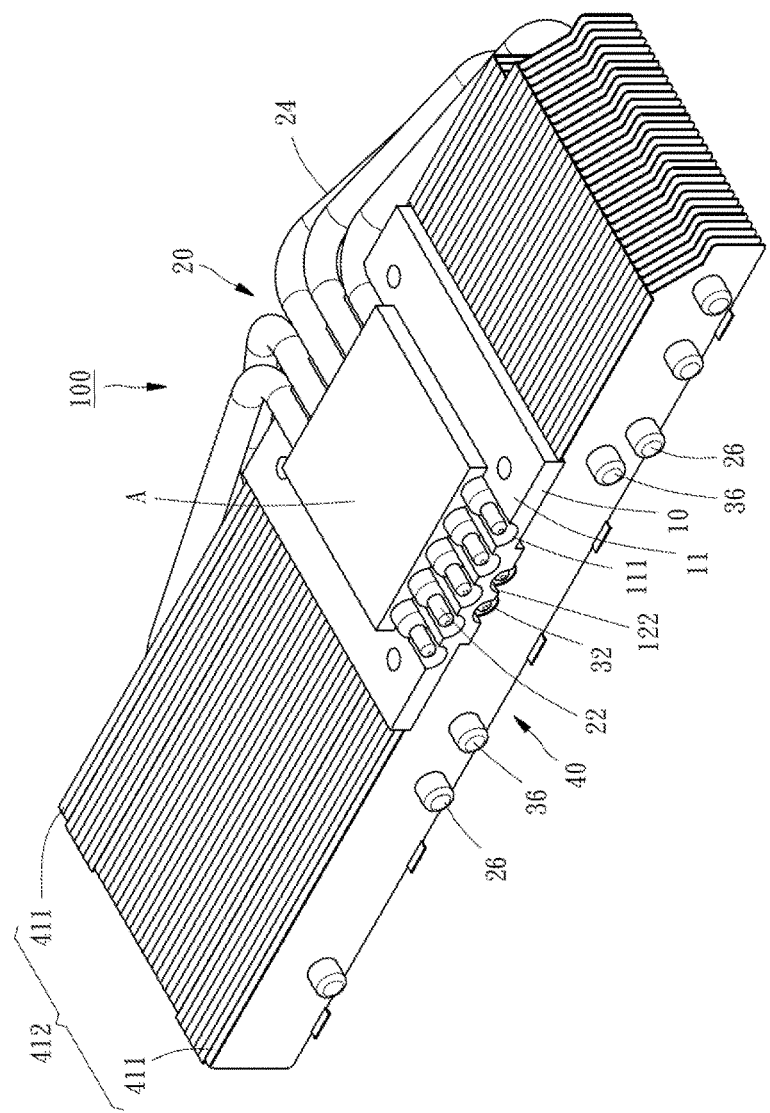
FIG. 1 is an oblique top elevational view of a heat dissipation structure in accordance with the present invention.

Referring to FIGS. 1-4, a heat dissipation structure 100 with heat pipes arranged in two spaced and partially overlapped layers in accordance with the present invention is shown. The heat dissipation structure 100 comprises a heat-dissipation spacer 10, a first heat dissipation layer 20, a second heat dissipation layer 30, and a radiation fin set 40.

Figure 2:
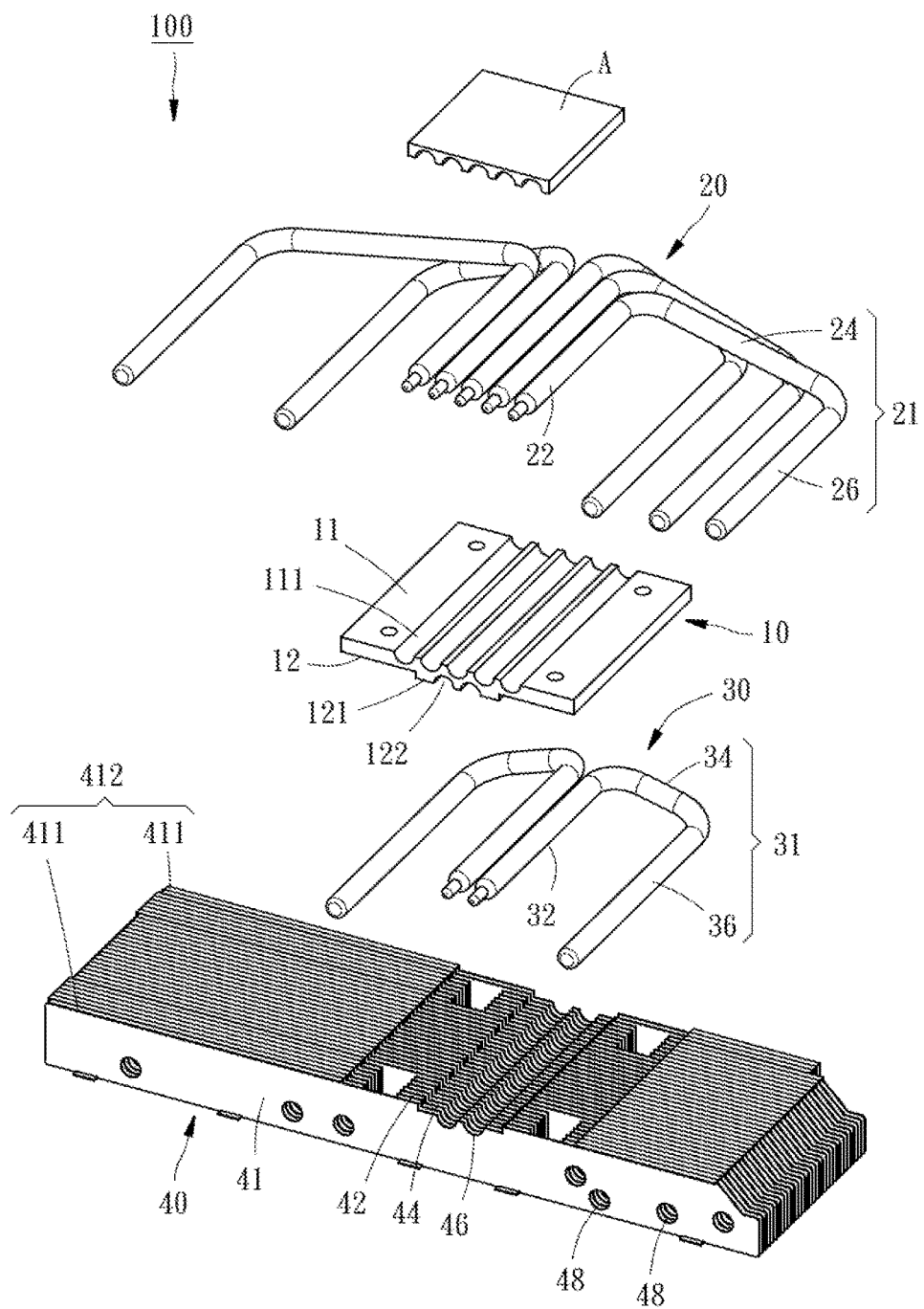
FIG. 2 is an exploded view of the first heat dissipation layer, heat-dissipation spacer, second heat dissipation layer and radiation fin set of the heat dissipation structure in accordance with the present invention.
Figure 3:
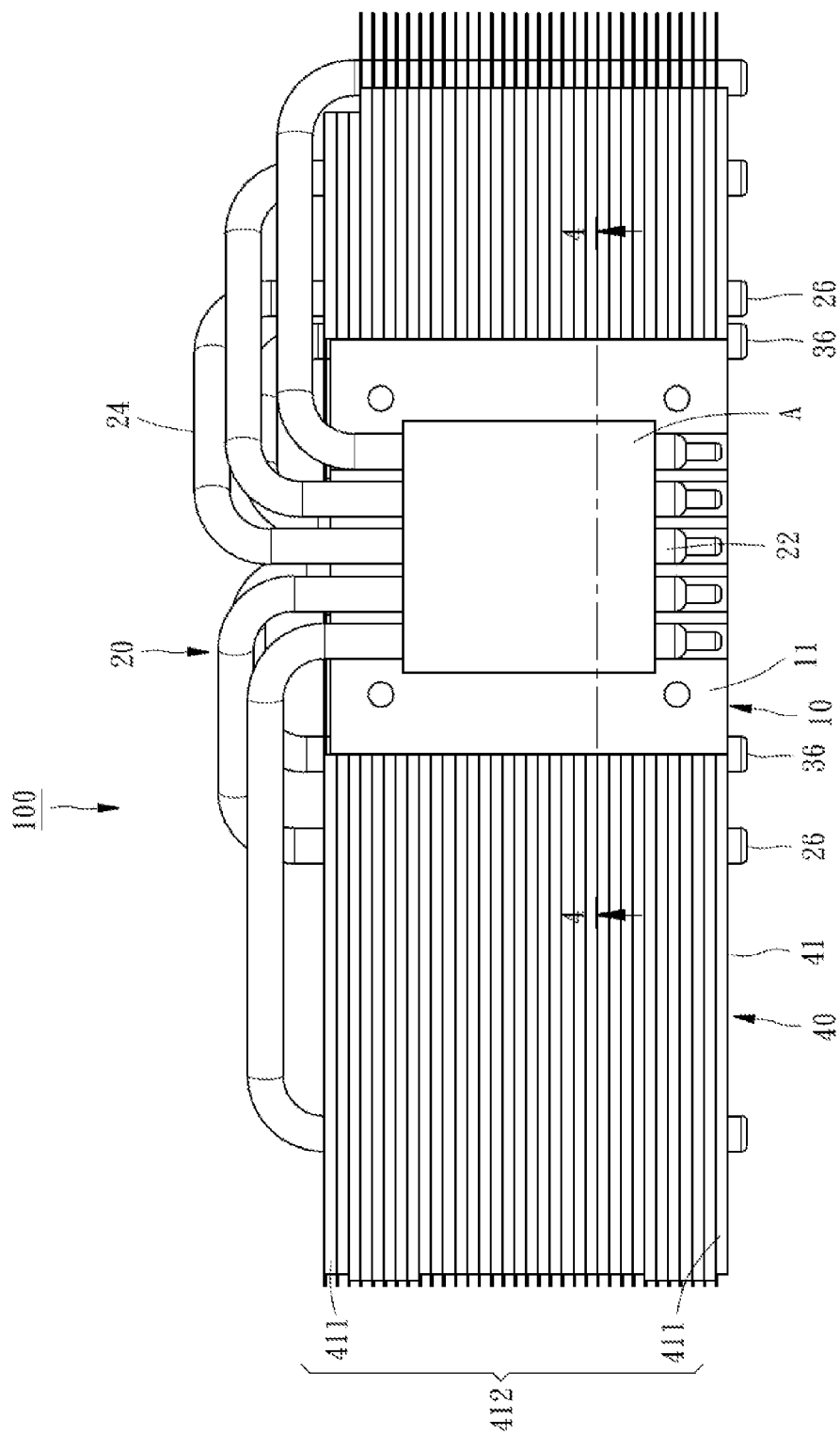
FIG. 3 is a too view of the heat dissipation structure in accordance with the present invention.

The heat-dissipation spacer 10 has two opposing surfaces, wherein one surface is defined as a first surface 11, the other surface is defined as a second surface 12, as illustrated in FIG. 2. In the present preferred embodiment, the first surface 11 of the heat-dissipation spacer 10 curves inwards to provide a plurality of first spacer grooves 111; the second surface 12 of the heat-dissipation spacer 10 curves outwards to provide a protruding block 121, which curves inwards to provide a plurality of second spacer grooves 122.

Figure 4:
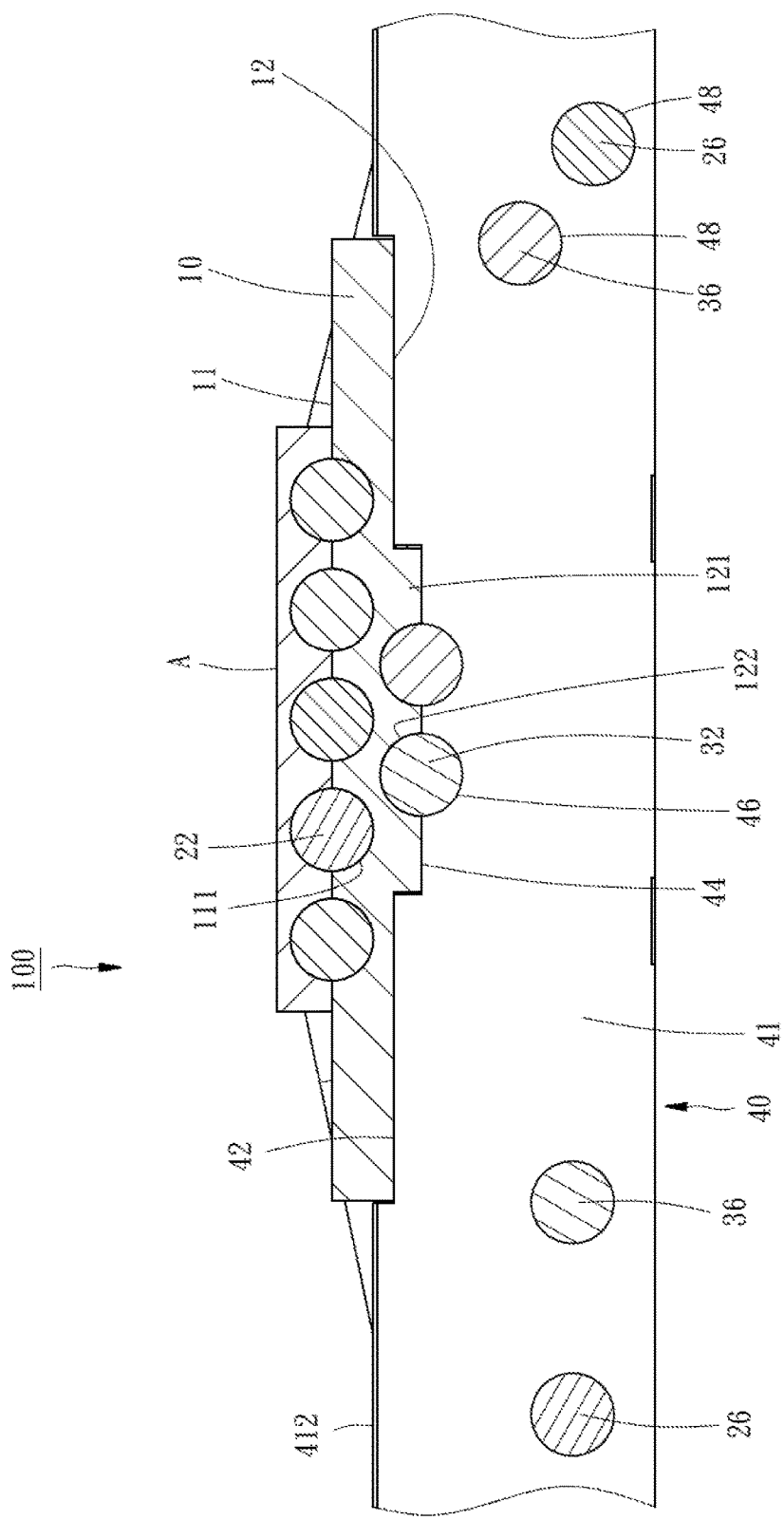
FIG. 4 is a sectional view taken along line 4-4 of FIG. 3, illustrating the object to the cooled down, the first heat dissipation layer, the heat-dissipation spacer, the second heat dissipation layer and the radiation fin set arranged in an overlapped and parallel manner.

The first heat dissipation layer 20 consists of a plurality of first heat pipes 21. Each first heat pipe 21 defines a first segment 22, a second segment 24 and a third segment 26. The second segment 24 is connected between the associating first segment 22 and third segment 26. The first segment 22 is positioned in the first surface 11 of the heat-dissipation spacer 10. Further, the first segments 22 of the first heat pipes 21 are arranged in parallel, as shown in FIG. 2. In this embodiment, the first segment 22 of each first heat pipe 21 has a bottom side thereof positioned in one respective first spacer groove 111, as shown in FIG. 4.

The second heat dissipation layer 30 consists of a plurality of second heat pipes 31. Each second heat pipe 31 defines a first segment 32, a second segment 34 and a third segment 36. The second segment 34 is connected between the associating first segment 32 and third segment 36. The first segment 32 is positioned in the second surface 12 of the heat-dissipation spacer 10. Further, the first segments 32 of the second heat pipes 31 are arranged in parallel, as shown in FIG. 2.

The radiation fin set 40 consists of a plurality of radiation fins 41. As illustrated in FIG. 2, the radiation fins 41 have a same respective peripheral edge 411 arranged together to provide a contact surface 412. The second surface 12 of the heat-dissipation spacer 10 is placed on the contact surface 412 of the radiation fin set 40. The first segments 32 of the second heat pipe 31 of the second heat dissipation layer 30 are sandwiched between the heat-dissipation spacer 10 and the radiation fin set 40, and kept in positive contact with the heat-dissipation spacer 10 and the radiation fin set 40, as illustrated in FIG. 4. Further, the third segment 26 of each first heat pipe 21 of the first heat dissipation layer 20 and the third segment 36 of each second heat pipe 31 of the second heat dissipation layer 30 are inserted through the radiation fin set 40. In the present preferred embodiment, the contact surface 412 of the radiation fin set 40 curves inwards to provide a first recessed portion 42, a second recessed portion 44 in the first recessed portion 42, and a plurality of third recessed portions 46 in the second recessed portion 44, as illustrated in FIG. 2. Further, the heat-dissipation spacer 10 has a part of the bottom side thereof positioned in the first recessed portion 42, wherein the protruding block 121 is positioned in the second recessed portion 44; the second spacer grooves 122 are respectively disposed to face toward the respective third recessed portions 46; the first segments 32 of the second heat pipes 31 are respectively set in between the respective third recessed portions 46 and the respective second spacer grooves 122 and kept in positive contact with the respective third recessed portions 46 and the respective second spacer grooves 122, as shown in FIG. 4. Further, the radiation fin set 40 defines therein a plurality of through holes 48. The combined total amount of the first heat pipes 21 and the second heat pipes 31 is equal to the amount of the through holes 48. The third segments 26 of the first heat pipes 21 and the third segments 36 of the second heat pipes 31 are respectively inserted through one respective through hole 48, as shown in FIG. 2 and FIG. 4.

Further, at least a part of the first segment 22 of at least one first heat pipe 21 of the first heat dissipation layer 20 is kept overlapped on at least a part of the first segment 32 of at least one second heat pipe 31 of the second heat dissipation layer 30 in a parallel manner. In the present preferred embodiment, at least a part of the first segment 22 of at least one first heat pipe 21 of the first heat dissipation layer 20 is kept overlapped on at least a part of the first segment 32 of each of all second heat pipes 31 of the second heat dissipation layer 30 in a parallel manner, as shown in FIG. 2 and FIG. 4.

After understanding of the structural features of the present invention, the operation of the present invention is outlined hereinafter.

Referring to FIGS. 1-4 again, put the object to be cooled down A into direct contact with the first heat pipe 21 of the first heat dissipation layer 20 and the first surface 11 of the heat-dissipation spacer 10, as shown in FIGS. 1, 3 and 4, enabling the object to be cooled down A to be overlapped on the first segments 22 of the first heat pipes 21 and the first segments 32 of the second heat pipes 31. The object to be cooled down A in this embodiment is a copper plate. At this time, the object to be cooled down A can transfer heat energy through two paths at the same time. In one heat transfer path, heat energy is transferred from the object to be cooled down A to the first segments 22 of the first heat pipes 21 of the first heat dissipation layer 20 and the first surface 11 of the heat-dissipation spacer 10, and then through the first surface 11 of the heat-dissipation spacer 10 to the second surface 12, and finally to the first segments 32 of the second heat pipes 31 of the second heat dissipation layer 30 and the radiation fin set 40. At the same time, in conjunction with the other heat transfer path, when heat energy is transferred to the first segments 22 of the first heat pipes 21 and the first segments 32 of the second heat pipes 31, it will also be transferred through the second segments 24 of the first heat pipes 21 to the third segments 26 and also through the second segments 34 of the second heat pipes 31 to the third segments 36, as illustrated in FIG. 2, and will then be transferred through the third segments 26,36 of the first and second heat pipes 21,31 to the radiation fin set 40, as shown in FIG. 4, achieving rapid heat transfer.

Therefore, the invention achieves the effect of: solving the problem of poor heat dissipation performance of one single heat pipe layer of the prior art technique. In the present invention, at least a part of the first segment 22 of at least one first heat pipe 21 of the first heat dissipation layer 20 is kept overlapped on at least a part of the first segment 32 of each of all second heat pipes 31 of the second heat dissipation layer 30 in a parallel manner, enabling heat energy generated by the object to be cooled down A to be transferred through the first heat dissipation layer 20, the heat-dissipation spacer 10, the second heat dissipation layer 30 and the radiation fin set 40, and simultaneously transferred through the third segments 26 of the first heat pipes 21 and the third segments 36 of the second heat pipes 31 to the radiation fin set 40 for quick dissipation, achieving rapid heat dissipation.

In the above-described preferred embodiment of the present invention, at least a part of the first segment 22 of at least one first heat pipe 21 of the first heat dissipation layer 20 is kept overlapped on at least a part of the first segment 32 of each of all second heat pipes 31 of the second heat dissipation layer 30 in a parallel manner, as shown in FIG. 2 and FIG. 4. However, this arrangement is not a limitation. In another embodiment of the present invention, at least a part of the first segment 22 of each of all first heat pipes 21 of the first heat dissipation layer 20 is kept overlapped on at least a part of the first segment 32 of at least one second heat pipe 31 of the second heat dissipation layer 30 in a parallel manner. This alternate form can easily be understood through the description of the above-described preferred embodiment of the present invention, and therefore, no any further illustration will be necessary.

It is to be noted that in the preferred embodiment of the present invention, the object to be cooled down A is a copper plate. However, this example is not a limitation. In actual application, the object to be cooled down A can be a heat spreader, CPU, or any other heat-generating electronic component.

What is claimed is:

1. A heat dissipation structure, comprising:
   a heat-dissipation spacer defining a first surface and a second surface opposite to said first surface;
   a first heat dissipation layer comprising a plurality of first heat pipes, each said first heat pipe comprising a first segment, a second segment and a third segment, the second segment of each said first heat pipe being connected between the first segment and third segment of the respective said first heat pipe, the first segment of each said first heat pipe being positioned in said first surface of said heat-dissipation spacer, the first segments of said first heat pipes being disposed in parallel;
   a second heat dissipation layer comprising a plurality of second heat pipes, each said second heat pipe comprising a first segment, a second segment and a third segment, the second segment of each said second heat pipe being connected between the first segment and third segment of the respective said second heat pipe, the first segments of said second heat pipe being positioned in said second surface of said heat-dissipation spacer, the first segments of said second heat pipes being disposed in parallel; and
   a radiation fin set comprising a plurality of radiation fins, each said radiation fin comprising a peripheral edge, the peripheral edges of said radiation fins being arranged together to provide a contact surface for enabling said second surface of said heat-dissipation spacer to be placed on said contact surface in such a manner that said first segment of each said second heat pipe of said second heat dissipation layer is set in between said heat-dissipation spacer and said radiation fin set and kept in contact with said heat-dissipation spacer and said radiation fin set; the third segment of each said first heat pipe of said first heat dissipation layer and the third segment of each said second heat pipe of said second heat dissipation layer are respectively inserted through said radiation fin set;
   wherein:
   at least a party of the first segment of at least one said first heat pipe of said first heat dissipation layer is disposed overlapped on at least a part of the first segment of at least one said second heat pipe of second heat dissipation layer in a parallel manner.

2. The heat dissipation structure as claimed in claim 1, wherein at least a party of the first segment of at least one said first heat pipe of said first heat dissipation layer is disposed overlapped on at least a part of the first segment of each of all said second heat pipes of second heat dissipation layer in a parallel manner.

3. The heat dissipation structure as claimed in claim 1, wherein said first surface of said heat-dissipation spacer curves inwards to provide a plurality of first spacer grooves; said second surface of said heat-dissipation spacer curves outwards to provide a protruding block, said protruding block being curved inwards to provide a plurality of second spacer grooves; the first segment of each first heat pipe has a bottom side thereof positioned in one respective said first spacer groove.

4. The heat dissipation structure as claimed in claim 3, wherein said contact surface of said radiation fin set is configured to provide a first recessed portion, a second recessed portion in said first recessed portion and a plurality of third recessed portions in said second recessed portion; said heat-dissipation spacer has a bottom side thereof positioned in said first recessed portion; said protruding block is positioned in said second recessed portion; each said second spacer groove is disposed to face toward one respective said third recessed portion; the first segment of each said second heat pipe is set in between one respective said third recessed portion and one respective said second spacer groove and kept in contact with the respective said third recessed portion and the respective said second spacer groove.

5. The heat dissipation structure as claimed in claim 1, wherein said radiation fin set comprises a plurality of through holes; the combined total amount of said first heat pipes and said second heat pipes is equal to the amount of said through holes; the third segments of said first heat pipes and the third segments of said second heat pipes are respectively inserted through one respective said through hole.

6. The heat dissipation structure as claimed in claim 1, further comprising an object to be cooled down disposed in direct contact with said first heat pipes of said first heat dissipation layer and said first surface of said heat-dissipation spacer.

* * * * *